United States Patent [19]

Mack et al.

[11] 4,382,739
[45] May 10, 1983

[54] LIGHT ACTUATING FORCE ELEVATOR DRIVE MECHANISM

[75] Inventors: Alfred Mack, Poughkeepsie; Brian C. O'Neill, Millbrook, both of N.Y.

[73] Assignee: International Business Machines Corporation, Armonk, N.Y.

[21] Appl. No.: 219,658

[22] Filed: Dec. 24, 1980

[51] Int. Cl.³ .......................................... H01J 37/20
[52] U.S. Cl. ..................... 414/217; 187/17
[58] Field of Search ..................... 414/217; 187/17

[56] References Cited

U.S. PATENT DOCUMENTS 1,136,140  4/1915  Jansson ........................... 187/17
3,968,885  7/1976  Hassan et al. ................. 414/217 X

FOREIGN PATENT DOCUMENTS 9736  4/1980  European Pat. Off. .
2529018  1/1977  Fed. Rep. of Germany .

*Primary Examiner*—Robert G. Sheridan
*Attorney, Agent, or Firm*—Sughrue, Mion, Zinn, Macpeak and Seas

[57] ABSTRACT

An elevator drive shaft is air pressure counter-balanced and dampened under varying load and system pressure conditions by applying required air pressure to an appropriate side of a piston moving with the drive shaft in an electron beam semiconductor wafer writing apparatus vacuum chamber. Air pressure counterbalancing load forces minimize the actuating forces required to drive the elevator, substantially minimizing vibratory shock and distortion to the electron beam writing system and increasing speed of wafer movement. This permits electron beam writing on one wafer simultaneously with a load/unload operation of a second semiconductor wafer. The counter-balancing load forces also minimize the probability of accidental damage to the system or semiconductor wafers due to uncontrolled high forces or upon mechanical impact between moving and fixed parts, during apparatus malfunction.

10 Claims, 3 Drawing Figures

LIGHT ACTUATING FORCE ELEVATOR DRIVE MECHANISM

FIELD OF THE INVENTION

This invention relates to elevator drive mechanisms particularly applicable to semi-conductor wafer electron beam writing apparatus subjected to high atmospheric pressure/vacuum pressure conditions during elevator raising and lowering, and an arrangement for minimizing vibratory shock and distortion to the apparatus components during elevator movement.

BACKGROUND OF THE INVENTION

Electron beam writing techniques have been satisfactorily employed as a means of pattern writing chips on a semiconductor wafer. The technique requires the writing to be achieved under very high vacuum conditions such as $3 \times 10^{-6}$ torr, for example. The semi-conductor wafer is required to be introduced to vacuum condition from a position exterior of the vacuum chamber which is essentially at atmospheric pressure, and removed from the vacuum chamber thereto, after pattern writing.

An apparatus for handling work pieces satisfactorily and for facilitating such wafer movement to and from the vacuum chamber, where electron beam application occurs, is set forth in U.S. Pat. No. 3,968,885 issuing July 13, 1976, entitled "Method and Apparatus for Handling Work Pieces" by Javathuk Hassan et al, and assigned to the common assignee. The transport of the semiconductor wafers therein, is achieved at relatively high speed by the utilization of a virtual antechamber formed by movable elements within and exterior of the main vacuum chamber itself. By employing an antechamber having a relatively small volume in comparison with that of the vacuum chamber, and on the order of approximately one hundredth the size of the vacuum chamber, the necessity to have the same vacuum level existing within the antechamber as the vacuum chamber is eliminated, since the pressure conditions in the relatively small antechamber are not sufficiently significant to affect the vacuum level within the vacuum chamber when communication is established between the antechamber and the vacuum chamber. However, due to the relatively small volume and lesser vacuum level required of the antechamber, the time for pumping down the antechamber, after presentation of a semiconductor wafer to that antechamber at atmospheric pressure, is considerably decreased over prior apparatus requiring the bringing of an auxiliary chamber to essentially the same vacuum pressure conditions as the vacuum chamber in which electron beam pattern writing of the semiconductor wafer is effected. Additionally, the elevator functions as a valve between the antechamber and the vacuum chamber, closing off communication therebetween in addition to raising and lowering the semiconductor wafer to and from a position within the antechamber where it is accessible to the exterior of the vacuum chamber. Once within the vacuum chamber, the wafer is sealed from the exterior, permitting lateral transfer from the elevator to an X-Y table, to one side thereof, where the wafer is precisely positioned with respect to an impinging electron beam.

In order to accomplish the raising and lowering of the elevator bearing the wafer between a first, raised or upper position in which the wafer is presented to the antechamber and sealed from the vacuum chamber itself, at which point, the cover or lid of the antechamber may be raised to provide access from the exterior of the vacuum chamber to the elevator for either placement of a wafer on the elevator or removal therefrom, and a second lowered position with the wafer positioned within the vacuum chamber and accessible to a lateral transfer mechanism for movement of the X-Y table, the apparatus of the above identified patent utilizes a drive mechanism comprising a tandem air/oil cylinder. The air cylinder functions as the driving force and the oil cylinder functions as a regulating device. However, the drive cylinder is sized to overcome the force generated when the top of the elevator, which seals itself to the top plate of the apparatus defining the vacuum chamber and which is open to the antechamber, is exposed to the atmosphere, upon raising of the antechamber lid or cover. With the vacuum chamber at very high vacuum pressure and the top of the elevator at atmospheric pressure, a considerably large pneumatic and/or hydraulic force is required to drive the cylinder against an applied pressure differential which may be on the order of 1000 pounds. Further, if the elevator and the internal transfer mechanism transferring the wafers laterally to and from the elevator is operated out of sequence, major damage is caused to these components and to the wafer carrier borne by the elevator. This may result in several days of shut down time to repair the apparatus.

It may be appreciated that the elevator drive must operate under certain different air pressure/vacuum pressure conditions;

(1) a condition, in an exemplary apparatus wherein the antechamber and the main chamber are both at high vacuum and in which there is approximately 140 pounds of force acting in the upward direction on the drive mechanism caused by atmospheric pressure acting on the bottom of the elevator which projects sealably through the bottom wall of the main vacuum chamber;

(2) a condition where the elevator is in its fully raised or up position, sealed to the top wall of the main vacuum chamber and sealing off the antechamber to the vacuum chamber. With the vacuum chamber at high vacuum pressure and the antechamber at atmospheric pressure, the difference between the force caused by the atmosphere acting on the bottom and top of the elevator and the weight of the mechanism causes, for example, a force of approximately 990 pounds to act on the drive mechanism in the downward direction. (This is the condition discussed previously);

(3) a condition in which the complete system is at atmospheric pressure and the weight of the elevator components applies a force of 50 pounds in the downward direction on the drive mechanism.

It is therefore an object of the present invention to provide an improved load elevator drive mechanism in which the loads encountered by pressure differential acting on the elevator are counterbalanced and dampened during varying antechamber and vacuum chamber pressure conditions, thereby allowing the elevator to be driven up and down with minimal force, and to allow the pressure differential to self seal the elevator to the vacuum chamber wall upon termination of elevator up drive and removal of the counterbalance force.

It is a further object of the present invention to provide an improved load elevator drive mechanism for an electron beam semiconductor wafer writing apparatus which eliminates shock and vibrating movement to the electron beam column to thereby permit electron beam writing on one wafer simultaneous with loading and/or unloading of a second wafer to and from the vacuum chamber where writing is occurring.

It is a further object of the present invention to provide an improved load elevator drive mechanism for an electron beam writing apparatus which includes positive mechanical locking means for preventing lowering of the elevator when the elevator top is exposed to atmospheric pressure and the vacuum chamber is at high vacuum.

SUMMARY OF THE INVENTION

The present invention is directed to an improved elevator drive mechanism for a vertically movable elevator positioned within a vacuum chamber as part of an electron beam writing system. The vacuum chamber bears electron beam generating means for beam writing on a workpiece positioned within the vacuum chamber and aligned with the beam. The elevator mechanism includes an elevator platform fixed to the drive shaft, and an actuating means for vertically raising and lowering the elevator shaft and its platform.

The improvement resides in a load force counterbalancing means connected to the elevator drive shaft to balance the various load forces acting on the elevator mechanism during operation. The load force counterbalancing means may include piston means to cause the load force counterbalancing means to apply a force to the elevator drive shaft in opposition to the load force. This places the elevator mechanism in a condition of substantially zero mass, thereby permitting rapid movement of the elevator platform by the elevator actuating means with minimal force and minimal vibration and shock to the system. Under such an arrangement a first workpiece may be moved by elevator mechanism while simultaneously electron beam writing may be effected on a second workpiece within the vacuum chamber, for increased workpiece throughput.

The vacuum chamber may comprise a horizontal wall which bears an opening permitting entry of the workpiece into the vacuum chamber with the workpiece placed on the underlying elevator platform, when the elevator platform is moved into the opening and seals the vacuum chamber, with the platform in a vertically raised position. Preferably, the system further comprises mechanical interlock means engageable with the elevator shaft, at least when the elevator platform is in the raised position, closing off the vacuum chamber to the exterior, to prevent platform movement away from the opening and accidental vacuum dump by the pressure differential exerted across the elevator platform, between the vacuum chamber and the chamber exterior, and tending to force the elevator platform towards vacuum chamber open position. The mechanical interlock means comprises means for preventing release of the elevator drive shaft until the pressure differential across the elevator platform is below a predetermined value.

The system may further comprise a movable lid acting to vacuum seal the opening within the chamber wall from the atmosphere when the elevator platform is removed from its raised position. The lid and the elevator platform form an antechamber therebetween when the platform is in its raised position and the lid vacuum seals the opening in the wall of the chamber. The system further comprises means for producing a vacuum in the antechamber after the platform receives the workpiece from the exterior of the chamber and before the platform is lowered from its raised, chamber closed position. The interlock means comprises means for preventing release of the elevator drive shaft until the lid is in chamber wall opening sealing position, and the pressure within the antechamber is reduced from atmospheric pressure to a predetermined vacuum pressure.

The mechanical interlock means may comprise a locking actuating slide cylinder mounted in juxtaposition to the elevator drive shaft with the locking slide actuator cylinder bearing a laterally shiftable drive shaft locking bar, movable towards and away from the drive shaft. The drive shaft locking bar is shiftable by the locking slide actuating cylinder between projected and retracted positions with respect to at least one notch within the side of the drive shaft, which notch receives the end of the drive shaft locking bar when the locking bar is in the projected position and the platform is in the vertically raised position.

A source of air pressure is supplied to the locking slide actuating cylinder to positively shift the drive shaft locking bar to said projected and retracted positions, in a selective manner. A high frictional force is exerted on the drive shaft locking bar by contact of the drive shaft locking bar with the drive shaft notch when the vacuum chamber is subjected to vacuum conditions and the surface of the platform covering the vacuum chamber wall opening is subjected to atmospheric pressure. The system includes air pressure control means for limiting air pressure applied to the locking slide actuating cylinder in a direction tending to move the drive shaft locking bar from projecting to retracted position, to a level which is below the level of the friction force on the drive shaft locking bar at said notch.

The load force counterbalancing means may comprise a load balancing cylinder fixedly mounted between the vacuum chamber and coaxial with the elevator drive shaft. A piston is fixedly coupled to the elevator drive shaft and slidable within the load balancing cylinder. Air pressure of appropriate value is selectively applied to a given face of the piston within the load balancing cylinder to counterbalance the force acting on the elevator mechanism due to the pressure differential within and without the vacuum chamber. A drive shaft actuating cylinder is mounted to the drive mechanism body parallel to the load balancing cylinder and to the side of the drive shaft. The drive shaft actuating cylinder bears a longitudinally extendable and retractable piston rod projecting from the end of the cylinder facing the elevator platform. An offset bracket fixedly mounted to the drive shaft, on one side thereof, has a portion projecting within the path of the drive shaft actuating cylinder piston rod. The piston rod bears a piston internally of said drive shaft actuating cylinder and has its opposite end coupled to the offset bracket such that extension and retraction of the drive shaft actuating cylinder piston rod causes the elevator drive shaft to be extended and retracted between a raised position closing off the vacuum chamber wall means opening and a lowered position permitting access to the interior of the vacuum chamber through said opening. Means are provided for selectively supplying air under pressure to the drive shaft actuating cylinder to respective sides of the piston carried thereby, at a controlled pressure and flow rate. The piston within the load balancing cylinder is air cushioned during bottoming out on both strokes to shift the elevator platform between its upper raised position and the lowered position and vice versa. At the lowered position, lateral transfer of a workpiece from the platform is permitted internally of the vacuum chamber, for electron beam writing thereon at a laterally displaced position.

A vertical up motion stop member bearing a resilient edge is adjustably fixedly mounted to the elevator drive shaft external of the vacuum chamber for movement vertically upward and into contact with a fixed vibration isolation plate to fix the position of the elevator platform at its raised position, sealing the opening within the vacuum chamber, with the notch borne by the drive shaft in alignment with the drive shaft locking bar. The elevator mechanism bears an elevator stop member fixedly mounted therein and within the vertical path of movement of an elevator platform carried resiliently cushioned abutment ring to limit the down movement of the elevator platform, from its raised position to its lowered position, thereby eliminating shock at elevator travel termination.

DESCRIPTION OF THE PREFERRED EMBODIMENT

Figure 1A:
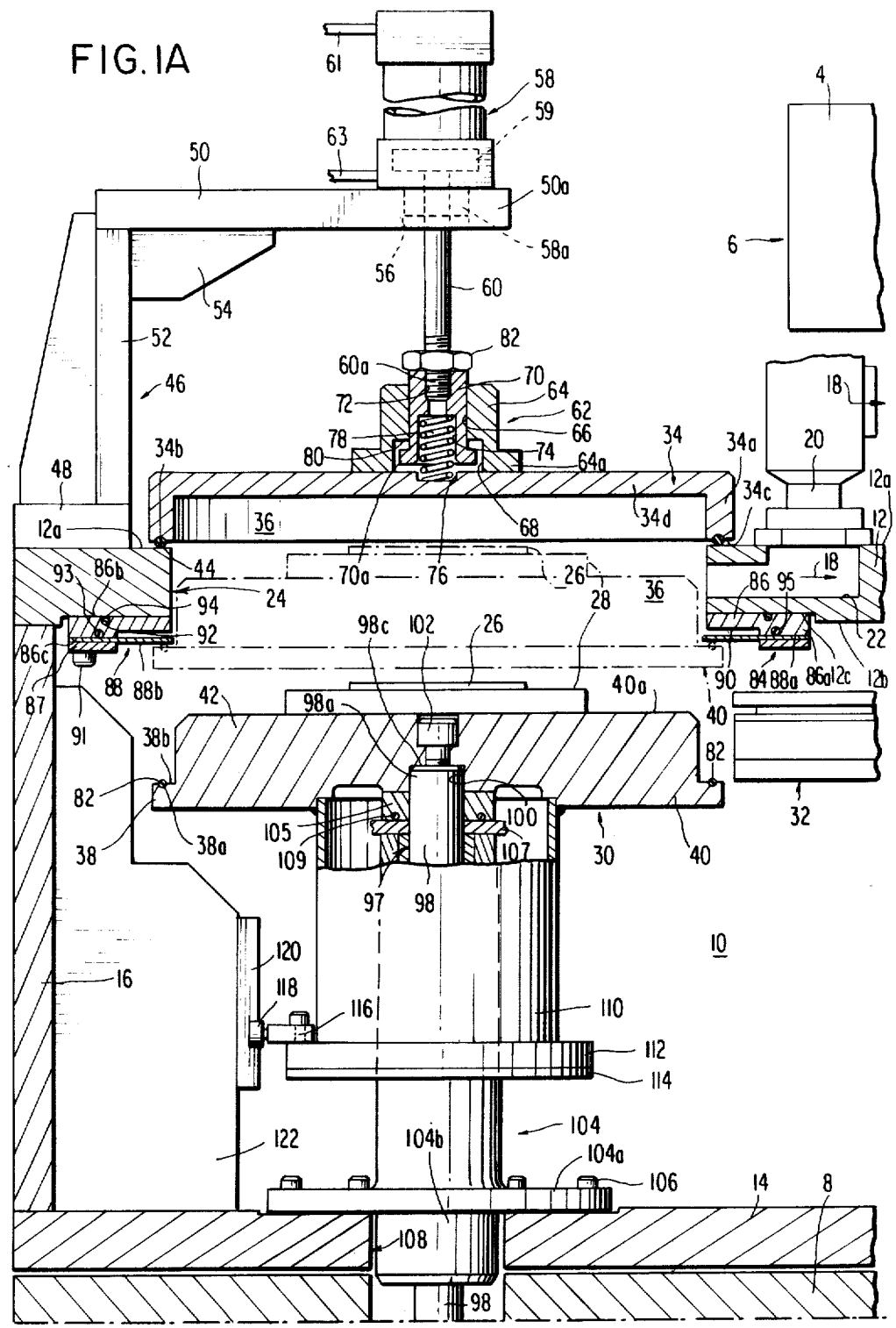
FIGS. 1A and 1B are vertical sectional views, partially broken away and in section, of upper and lower portions, respectively of the improved load elevator drive mechanism forming one embodiment of the present invention for a vacuum chamber type, electron beam semiconductor wafer writing apparatus.
Figure 1B:
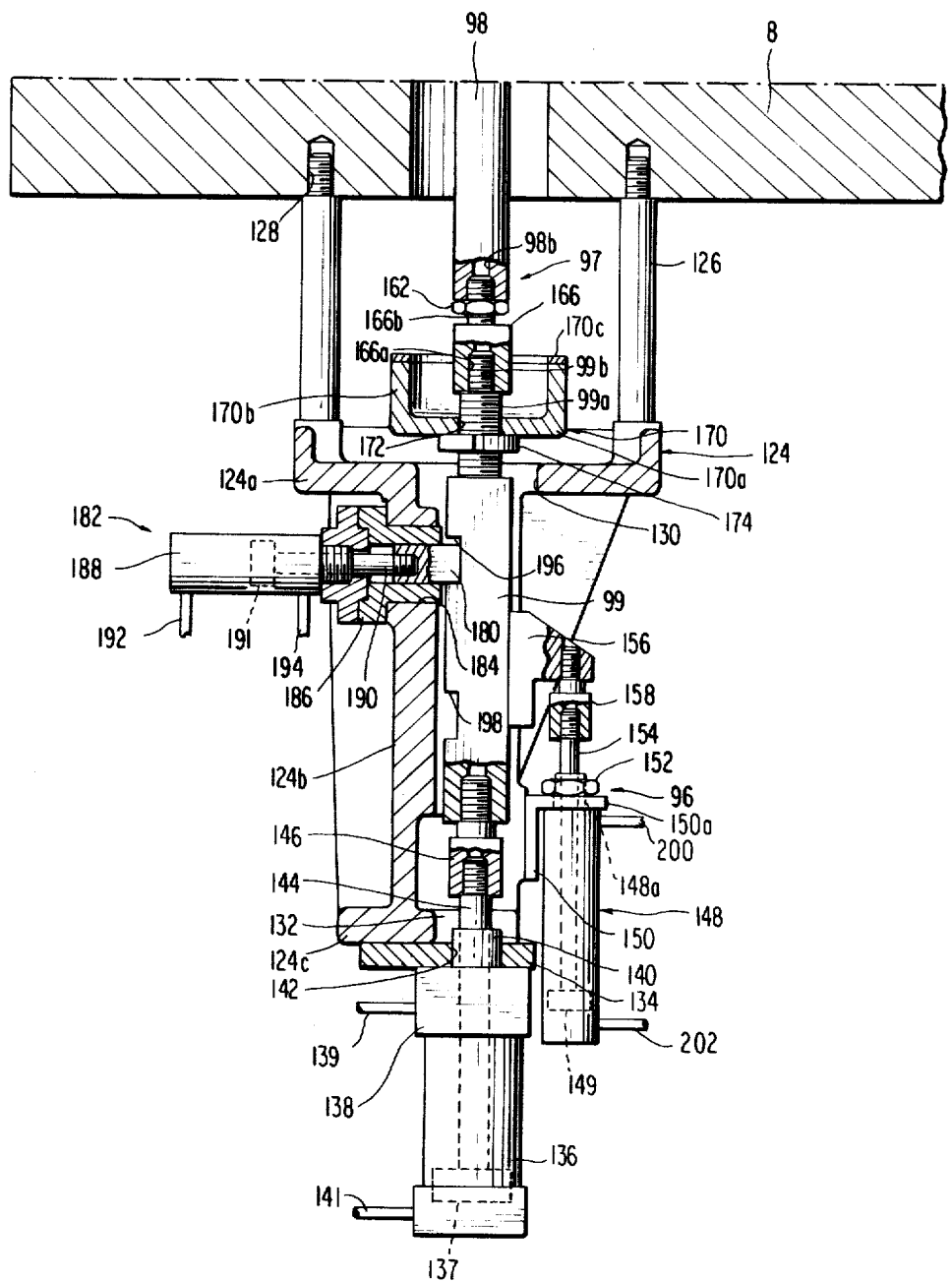

Referring to FIGS. 1A and 1B of the drawings, there is shown generally at 10 a vacuum chamber of a vacuum chamber type, electron beam semiconductor wafer electron beam writing apparatus 6 including an electron beam column, which in many respects is similar in structure, function and operation to that of the referred to U.S. Pat. No. 3,874,525. The vacuum chamber 10 is mounted to the top of the vibration isolation plate or table 8. The vacuum chamber 10 is formed by a top wall 12, a bottom wall 14 and suitable, interposed sidewalls, as at 16. The vacuum chamber 10, which is the main chamber within which electron beam writing of serially presented semiconductor wafers is effected, is kept at a suitable vacuum pressure by way of a vacuum pump (not shown) which may be a combination ion pump/titanium sublimation pump. Vacuum pressure is also supplied as indicated schematically by arrow 18 through a solenoid operated valve 20 via channel 22 within the top wall 12 to the interior of an antechamber 36, partially formed by way of the circular hole 24 within the top wall 12.

In line with the referred to patent, an optical column 4 is supported on the top wall 12 of the vacuum chamber which controls the application of electron beams to a semiconductor wafer 26 (when properly positioned relative thereto). The wafer 26 is illustrated as positioned on a wafer carrier 28, centered on and supported by an elevator indicated generally at 30. The elevator 30 includes a vertically movable platform 40, directly bearing the wafer carrier 28, which is shown in a lowered position, within chamber 10 and at a height enabling horizontal, lateral transfer of the wafer carrier 28 to an X-Y table (not shown) to the right of elevator 30, FIG. 1. That transport is effected by a transfer mechanism indicated generally at 32.

Each of the wafers 26 is caused to enter vacuum chamber 10 from the exterior of that chamber through the hole or opening 24. Elevator 30 is vertically movable to cause the wafer carrier 28 to be raised to an elevated position, above the top surface 12a of top wall 12. The apparatus is provided with a vertically displaceable antechamber lid 34, which is of a diameter in excess of the diameter of hole 24 within the top wall 12, so as to overlie the hole. Lid 34 seals on seal 34b on its periphery, about holes 24 and against the upper surface 12a of top wall 12 of the vacuum chamber 10, when in the lowered position. When elevator 30 is at its raised or upper position, there is created antechamber 36, sealed off from the interior of the main vacuum chamber 10 by means of an enlarged diameter lip or rim 38 of the elevator platform 40. Lip 38 of platform 40 contains a resilient O ring seal 82, on face 38b, within annular recess 38a, sealed to diaphragm assembly 88 attached to the bottom surface 12b of the top wall 12. With antechamber lid 34 sealed to the top surface 12a of that member, the relatively small volume antechamber 36 can be subjected to vacuum pressure at a vacuum level much lower than the vacuum pressure within vacuum chamber 10 by means of solenoid operated control valve 20 which connects the antechamber 36 by way of passage 22 to a source of vacuum pressure indicated schematically by arrow 18.

The movement of the wafer carrier 28 and wafer 26 from a point exterior of the vacuum chamber 10 to the interior of that chamber is effected without any significant variance in the vacuum level within the vacuum chamber 10. When seals are effected between antechamber lid 34 and the top wall 12 of chamber 10, and the elevator platform rim 38b and annular, resilient metal diaphragm 88, a reduced diameter portion 42 of the platform 40 is interposed within hole 24, and is spaced circumferentially therefrom. A very small volume antechamber 36 results due to the small clearance between the elements making up the antechamber 36.

Contrary to system and apparatus of the prior cited patent, where the drives for the antechamber lid 34 and elevator have no stops on the drive cylinder and there is sole reliance on the sealing surfaces, that is, the rim or lip 38 of the elevator platform 40 and the peripheral edge of the antechamber lid 34 to stop these elements, both the elevator and the antechamber lid 34 are provided with means to cushion the sealing contact of these members with the vacuum chamber top wall 12, during creation of the antechamber 36. Both drive mechanisms have integral stops to eliminate application of excess force to the chamber components which could cause distortion to the pattern being written by the electron beam on the wafer to the side of the elevator mechanism illustrated in FIG. 1. Further, the illustrated apparatus is provided with internal cushions to control the speed at the end of the stroke of both the antechamber lid 34 and the elevator platform 40 to assure acceptable shock loads when stops in sealing surfaces are contacted. To assure the sealing of the antechamber lid 34, a minimal force must be applied to a resilient O-ring 44 which is fixed to the annular flange 34a of that member. The O-ring 44 is partially received within circular groove 34b borne by the confronting edge 34c of the inverted cup-shaped antechamber lid 34. The O-ring 44 seats on the upper surface 12a of the top wall 12 of vacuum chamber 10. The antechamber lid 34 being cup-shaped in configuration, includes a transverse base portion 34d which spans the hole 24 and annular rim portion 34a. The rim portion 34a may have an internal diameter on the order of hole 24 so as to lie flush with the sidewall of the opening or hole 24.

The top wall 12 of the vacuum chamber 10 is provided with a bracket assembly indicated generally at 46 including a base 48 which may be screwed or otherwise affixed to the upper surface 12a of the top wall 12, to one side of the hole or opening 24. The bracket assembly 46 is provided with a transverse support beam 50 at the upper end of a vertical riser 52, these parts being welded together and reinforced by reinforcing member 54 to provide rigidity to the structure. Beam 50 is cantilever mounted, with an end 50a overlying the center line of the elevator 30 and its platform 40, as well as hole 24 within the vacuum chamber top wall 12. The support beam 50 is provided with a cylindrical hole as at 56, within which projects a reduced diameter portion 58a of an antechamber lid actuating air cylinder indicated generally at 58. Preferably the complete control system for the elevator is pneumatic. Projecting downwardly from the lower end of antechamber lid actuating cylinder 58 is a piston rod 60, the upper end of which bears a piston 59 within cylinder 58. Rod 60 is mechanically coupled at its lower end to the antechamber lid 34 by an adjustable shock absorbing mechanism indicated generally at 62. In this respect, fixedly mounted to the antechamber lid 34, and coaxial therewith, is a cylindrical casing 64, bearing, at its lower end, an enlarged diameter rim or flange portion 64a. The cylindrical casing 34 is provided with a bore at 66 and is counterbored at 68 in the vicinity of the rim 64a. Bore 66 slidably mounts a cylinder 70 having an outside diameter slightly less than the diameter of bore 66. The cylinder 70 is provided with a tapped and threaded bore 72, and is further counterbored at 74. The piston rod 60 is threaded at its lower end as at 60a and is threaded to the tapped and threaded bore 72 of cylinder 70. Cylinder 70 terminates at its lower end in radially enlarged flange 70a having an outer diameter somewhat less than the diameter of counterbore 68 of casing 64, but larger than the diameter of bore 66 of the casing. Flange 70a functions as a stop to limit upward travel of the cylinder 70 within the casing 64. Preferably, the top of the antechamber lid 34 bears, at its center a, shallow circular recess 76. A coil spring 78 having a diameter less than the diameter of counterbore 74 and recess 76, has one end positioned within the counterbore 74 and has its opposite end disposed within the shallow circular recess 76. The coil spring 78 has an axial length such that when the coil spring is partially relaxed and extended, the radial flange or rim portion 70a of sleeve 70 abuts a shoulder 80 formed between bore 66 and counterbore 68 of casing 64. Further, a lock nut 82 is threaded to the threaded end 60a of shaft 60, which functions to lock the cylinder 70 at a predetermined axial threaded position on the piston rod 60, thus setting the compression of spring 78.

As may be appreciated, the antechamber lid 34 is forcibly lowered from a raised position, normally several inches above the upper surface 12a of top wall 12 of the vacuum chamber 10 to a position where the O-ring seals 44 are pressed against the upper surface 12a of the top wall 12 to seal off the antechamber 36 and/or vacuum chamber 10 to the exterior of the apparatus. Depression of the antechamber lid 34 occurs by supplying air under pressure to the antechamber lid actuator cylinder 58, via line 61, and against the upper surface of piston 59 within the cylinder 58. As the piston rod 60 projects from the cylinder 58, the interposition of the coil spring 78 between cylinder 70 and the antechamber lid 34 causes the lid 34 to travel downwardly with the piston rod 60 to the point where the resilient O-ring seal 44 contacts the upper surface 12a of the vacuum chamber top wall 12. Not only is initial impact between these members cushioned by the coil spring 78, which compresses slightly, as shown in FIG. 1A, but the compression of the coil spring 79 is adjustably preset to assure the seal of the antechamber lid 34 by spring pressure compression of O-ring seal 44. A minimal force is maintained on the 0-ring 44 by compression of coil spring 78. Thus, actuating cylinder 58 applies a downward force against the coil spring 78 purely to control the sealing force exerted by the somewhat flattened O-ring 44 against the surface 12a of the top wall 12 and about the periphery of hole 24. To raise the lid 34, air pressure is applied to the opposite side of piston 59 via line 63. Air cylinder 58 is a standard air cushion type pneumatic cylinder such as that sold under the trade name ALCON.

Piston 59 in cylinder 58 bottoms out in the bore in both up and down positions. The height of the lid 34 in the up position is determined by the height of bracket 46. The downward force against the "O" ring 44 between lid 34 and sealing surface 12a is determined by adjusting piston rod 60 via thread 60a in cylinder 70. The amount spring 78 is compressed when piston 59 bottoms out controls the force compression "O" ring 44.

In addition, the seal between the elevator platform 40 and the main vacuum chamber 10, at the antechamber 36, is accomplished through a second "O-ring" borne by the elevator platform 40. In this respect, the sealing arrangement utilizes, similar to U.S. Pat. No. 3,968,885, an O-ring 82 borne by the lip or rim 38 of the elevator platform 40. However, instead of contacting directly the bottom surface 12b of the top wall 12 of the vacuum chamber 10, means are provided for cushioning this contact and permitting a slight overtravel of the elevator 30 without deformation to the vacuum chamber 10 by a mechanism which insures a reduction in shock at the initial time of effecting a seal between the elevator platform 40 and the vacuum chamber 10, about hole or opening 24.

A shallow annular groove 38a is formed within the upper surface 38b of the rim 38, which partially received a compressible resilient O-ring or seal member 82. The bottom surface 12b of top wall 12 bears an annular recess 12c, about hole 24, which recess fixedly mounts a diaphragm seal assembly indicated generally at 84. Assembly 85 is comprised of an annular base member or diaphragm mounting ring 86 of modified L-shaped cross-section, having an inner diameter on the order of hole 24 and an outer diameter which is slightly less than the diameter of the peripheral recess 12c, within top wall 12, within which mounting ring 86 is positioned. Ring 86 is provided with an annular recess 90 at its inner periphery forming leg 86a. An annular sheet metal diaphragm 88, formed of spring steel or the like and having inner and outer diameters corresponding to that of ring 86, is fixedly mounted to ring 86 along its outer peripheral edge 88a, with its inner peripheral edge 88b free of mounting ring 86 and spanning mounting ring recess 90. The diaphragm 88 is free to flex somewhat at the inside but is rigidly held at the outside by the mounting ring 86. A series of screws of bolts 91 may act to mount the diaphragm 88 to mounting ring 86 via ring 87, and the assembly to the top wall 12. Further, mounting ring 86 is provided with an annular groove 92 on one face 86b which groove bears an O-ring seal 94, sandwiched between ring 86 and the bottom of recess 12c. Another "O" ring seal 93 is required between ring 86 and diaphram 88, within a second annular groove 95 on face 86c of ring 86. This insures the maintenance of a seal between antechamber 36 and vacuum chamber 10, particularly under high pressure differentials which exists when the lid 34 is raised and the antechamber 36, i. e., the top of the upper surface 40a of platform 40 is open to the atmosphere, with chamber 10 subjected to a high vacuum pressure.

As may be appreciated, the seal between the elevator 30 and the main vacuum chamber 10 at the antechamber 36, is accomplished by means of the O-ring 82 borne by the elevator platform 40 impinging upon the inner edge 88b of flexible diaphragm 88. A small amount of overtravel, in the up direction, is experienced by platform 40 after O-ring 82 contacts diaphragm 88, before a stop is contacted which forcibly stops the drive mechanism for elevator 30. Vacuum chamber 10 will not be deformed since the inner edge 88b of the diaphragm 88 is permitted to flex towards the recess 90 within base 86 of the diaphragm assembly 84. The diaphragm 88 also functions to reduce the shock when the elevator borne O-ring 82 contacts the flexible sealing surface afforded by the diaphragm inner edge 88b of this assembly and during stoppage of the elevator 30 at its raised position.

As may be appreciated, the operations involving elevator 30 and lid 34 are controlled such that the lid 34 is not raised from sealing engagement with the top wall 12 of the vacuum chamber 10 until the vertical rise of elevator 30 is completed to the extent where sealing is effected between lip 38, via O-ring seal 82, and diaphragm 88, that is, the formation of a second seal with top wall 12 by way of elevator platform 40.

The present invention is directed to the improved elevator drive mechanism 96 and its control system for elevator 40, FIG. 1B. The Mechanism 96 occupys a position external of vacuum chamber 10 and below the vibration isolation plate 8. The elevator 30 is formed principally by the cylindrical elevator platform 40 which is vertically raised and lowered by way of a drive shaft assembly indicated generally at 97, including elevator drive shaft 98. The upper end 98a, of drive shaft 98 is received within a circular hole 100 central of the elevator platform 40. The end 98c of the shaft 98 bears a tapped and threaded hole and a screw 102 threaded thereto, functions to lock the elevator platform 40 to the upper end 98a of the shaft 98. The screw 102 is received within a bore and counterbore within the upper surface of platform 40. The elevator drive shaft 98 extends downwardly and projects through the main chamber bottom wall 14 as well as the vibration isolation plate 8. In that respect, and as may be appreciated by reference to U.S. Pat. No. 3,968,885, the elevator rises within a cylindrical pedestal 104 having a flanged portion 104a which is bolted to the upper surface of bottom wall 14, by way of bolts 106. The chamber bottom wall 14 is provided with a hole at 108 of suitable diameter which is slightly larger than a downwardly projecting portion 104b of pedestal 104. Thus the pedestal 104 is securely located on the main chamber bottom wall 14 and held in place within the vacuum chamber 10, so as to project upwardly about the elevator drive shaft 98. A cylindrical metal tube 110 is welded at its upper end to the bottom of the elevator platform 40, internally of the rim 38, the tube being coaxial with the elevator platform and drive shaft 98. The lower end of the tube 110 carries an annular block 112 having fixed thereto, annular plate 114. Internally of the tube 110, there is provided a metallic bellows assembly (not shown) which may be identical to that of the referred to patent. A bellows (not shown) is fixed at one end to annular plate 114, the opposite end of the bellows is fixed via an annular abutment 107 plate, to the upper end of pedestal 104. The function of the bellows and additional seals is to prevent pressure loss from the vacuum chamber to the exterior via the axially movable drive shaft 98. Thus, the vacuum chamber 10 is sealed from the space between the shaft 98 and the hollow pedestal 104 within which the shaft rides. This arrangement forms no part of the present invention. Platform 40 bears annular stop 105 which carries on its lower face, a resilient O-ring 109 to cushion the stop of elevator 30 in the down direction.

Suitable antifriction bearings (not shown) are interposed between shaft 98 and pedestal 104 to absorb loads on the shaft and to permit the raising and lowering of the elevator 30 in response to the needs of the system.

Mounted to the upper surface of annular block 112 is a roller support arm 116 bearing a pair of rollers 118 for rotation about a horizontal axis. Rollers 118 are mounted to arm 116 for rotation about horizontal axes in contact, respectively, with opposite sides of a vertical, longitudinal guide member 120. Member 120 is fixed to a sidewall 16 via bracket 122. This arrangement prevents rotation of the elevator 30 about the shaft axis but provides no restraint against raising and lowering of the elevator. The elevator drive mechanism 96 FIG. 1B, as an assembly, mounts beneath the vibration isolation plate 8 by way of a cast metal drive mechanism body 124. The body 124 is supported by a plurality of vertical posts 126 extending upwardly from a transverse base or plate portion 124a. The upper ends of posts 126 are threaded and mounted to the vibration isolation plate within tapped and threaded holes 128. The drive mechanism body base 124a bears a central, rather large diameter, hole 130 through which projects one section the drive shaft assembly 97, specifically an actuating drive shaft 99. Shaft 99 may be of rectangular cross-section and is preferably mounted on cross roller bearing slides (not shown). Projecting downwardly from base 124a of body 124, is a vertical leg 124b which is generally U-shaped in transverse cross-section. Leg 124b terminates in a flange portion 124c which bears recess 132. Mounted to the bottom of the flange portion 124c of the drive mechanism body 124, is a load balancing cylinder mounting plate 134. The load balancing cylinder mounting plate 134 has mounted thereto a load balancing cylinder 136 in the place of the actuator cylinder of the elevator drive mechanism of the referred to patent. The cylinder 136 bears an end cap 138 at its upper end which terminates in a reduced diameter portion 140. The reduced diameter portion 140 of end cap 138 projects through a hole 142 within mounting plate 134 with the cylinder 136 being fixed to plate 134. Projecting upwardly from one end of the load balancing cylinder 136 is a piston rod 144 which connects, at that end to the actuating drive shaft 99 via a suitable threaded tubular coupling 146. The function of the load balancing cylinder 136 is not to drive the elevator between its raised and lowered position. It is purely to balance the load experienced by the elevator at its various positions depending upon pressure conditions within and without the antechamber 36 and the vacuum chamber 10.

The drive of the elevator is achieved via a drive shaft actuating cylinder 148 which is fixedly mounted to the drive mechanism body leg 124b to the side of load balancing cylinder 136. It is fixed at its upper end to body leg 124b by mounting bracket 150. Cylinder 148 terminates at its upper end in a reduced diameter portion 148a which is threaded to a laterally projection leg 150a of bracket 150 through which is projects. The threaded portion of cylinder 148 bears a lock nut as at 152, locking the drive shaft actuating cylinder 148 to the bracket 150. The drive shaft actuating cylinder is supported such that it axis and that of its piston rod 154, are parallel to the axis of rod 144 of the load balancing cylinder 136. Projecting outwardly from the side of the rectangular cross-section drive shaft section is an offset coupling bracket 156 and to the lower face thereof, is rigidly coupled a tubular coupling member 158. The lower end of coupling member 158 threadably receives the upper end of piston rod 154. Thus, by projection and extraction of piston rod 154, the actuating drive shaft 99 is raised and lowered, being restrained against any movement, except vertical, by means of the cross-roller bearing slides. The upper end 99b of actuating drive shaft 99 is connected to the elevator drive shaft 98 through a coupling 166 which compensates for any angular or linear displacement between the elevator drive shaft 98 and the actuating mechanisms drive shaft 99. Reduced diameter shaft portion 99b threads to a tapped and threaded hole 166a within coupling 166. Threaded portion 166b of coupling 166 threads to the end of the elevated drive shaft 98. The threaded portion 166b at 98b bears a lock nut as at 162, permitting locking of the actuating drive shaft 99 to the elevator drive shaft 98 via coupling 166 in an adjustably fixed axial relationship.

Coupling 166 being threaded to the reduced diameter portion 99b of the actuating drive shaft 99 abuts larger diameter portion 99a of the shaft 99. Coupling 166 is thread locked to the drive shaft 99 and it has an outside diameter which is in excess of the diameter of shaft portion 99a. Thus, it functions as an upper stop for the axial movement of a cup-shaped, up motion stop 170. Stop 170 includes, integrally a transverse base 170a and an annular vertical sidewall 170b with a hole within its center, as at 172, which is tapped to fit of threaded shaft portion 99a, allowing stop 170 to be adjusted thereon. The threaded shaft portion 99a bears a lock nut as at 174 to lock the up motion stop 170 limit of up motion of the elevator 30. Elevator 30 stops by contact between a resilient ring 170c on the cup-shaped, up motion stop 170 and the bottom of the vibration isolation plate 8.

As may be further appreciated, descent of the elevator 30 by operation of drive shaft actuating cylinder 148, is limited to an extent defined by stop 105 attached to elevator 30 contacting the top of abutment 107. "O" ring 109 is inserted in stop 105 to cushion the impact of the contact.

As may be appreciated, the up motion stop 170 may be vertically adjusted on the shaft portion 99a of the actuating drive shaft 99 to insure that the resilient ring 170c of the cup-shaped stop abuts the vibration isolation plate after the O-ring seal 82 on lip 38 of the elevator platform 40 abuts the diaphragm 88 with slight flexing of that diaphragm to dampen the upward movement of the elevator and to significantly reduce any impact between the up motion stop 170 and the fixed vibration isolation plate 8. The resilience of ring 107c also contributes to the damping function.

All of the cylinders illustrated in the drawings are air cylinders. The load balancing cylinder 136 of the illustrated embodiment is provided internally with a piston 137 fixed to the end of piston rod 144 of that cylinder 136. Load balancing cylinder 136 may also comprise an air cushioned air cylinder of the ALCON type with the piston 137 bottoming out via an air cushion to eliminate shock at both ends of the stroke. Appropriately, lines 139 and 141 permit application of air pressure to either of the respective sides of piston 137 so as to load the balancing cylinder appropriately to balance out forces acting on the elevator platform 40 in response to pressure differentials existing across that platform, that is from antechamber 36 to the vacuum chamber 10 or from the atmosphere to the vacuum chamber 10 when lid 34 is in its raised position. Thus, the air cylinder 136 which is coupled to the bottom section of the drive shaft 98 functions to balance or counteract the forces under operating conditions 1 and 3, discussed above, by applying required air pressure to the appropriate side of the cylinder piston 137.

The apparatus of the present invention is further provided with a drive shaft locking bar 180 forming a movable stop member for a locking slide actuating assembly indicated generally at 182. This assembly is mounted to the drive mechanism body leg 124b within an opening 184 which is at right angles to the axis of the drive shaft section 98b. The opening bears a cylindrical casing 186 within which is slidably mounted the drive shaft locking bar 180, appropriately sized and configured thereto. Casing 186 has mounted, on its end remote from the drive shaft section 98b a locking slide actuating air cylinder 188. Cylinder 188 carries a piston rod 190, bearing piston 191, internally of cylinder 188. Rod 190 is coupled at its outboard end, to the drive shaft locking bar 180. Cylinder 188 receives air under pressure, selectively by way of lines 192 and 194 such that the piston when displaced to the left in the figure, retracts the drive shaft locking bar from its projected position, as shown, to permit vertical raising of the drive shaft 98. In this respect, the actuating drive shaft 99 is provided with upper and lower locking notches 196 and 198 on one side thereof, which selectively receive the projecting end of the drive shaft locking bar 180 when the elevator 30 is in its full down and full up positions, respectively. Thus, the drive shaft locking bar mechanism 182 provides positive up and down elevator position control. It may also be used to overcome the downward force generated by the elevator during operating condition No. 2 referred to previously and provides a mechanical interlock to prevent a vacuum dump of the main chamber. The mechanical interlock is achieved by keeping the actuating force of the locking mechanism cylinder that is the air pressure via line 194 below the frictional force acting against the locking bar, generated by the force of atmospheric pressure acting on the top of the elevator under operating condition No. 2. Therefore, the locking bar cannot be disengaged unless the antechamber is evacuated.

By providing a pressure regulator to line 194, air pressure through line 194 to the locking slide actuating cylinder 188 can only apply a force through the piston 191 and via rod 190 to the drive shaft locking bar 180 which is below the frictional force acting against the locking bar 180 by the atmospheric pressure acting on the top of the elevator platform 40 (operating condition No. 2 referred to above). It may be thus seen that the locking bar 180 cannot be disengaged from the locking notch or groove 198 unless and until the antechamber 36 is evacuated at which point adequate pressure is available through line 194 to force the piston within cylinder 188 to the left, driving bar 180 from notch 198. This then permits the shaft 99 to be driven downwardly by way of drive shaft actuating cylinder 148. Cylinder 148 is provided with lines as at 200 and 202, permitting application of air under pressure to a given side of the piston 149 fixed to the end of rod 154 and within the cylinder 148 so as to produce the desired up or down movement of the offset bracket 156, thus driving the shaft assembly 97 and the elevator vertically to its raised or lowered position.

Figure 2:
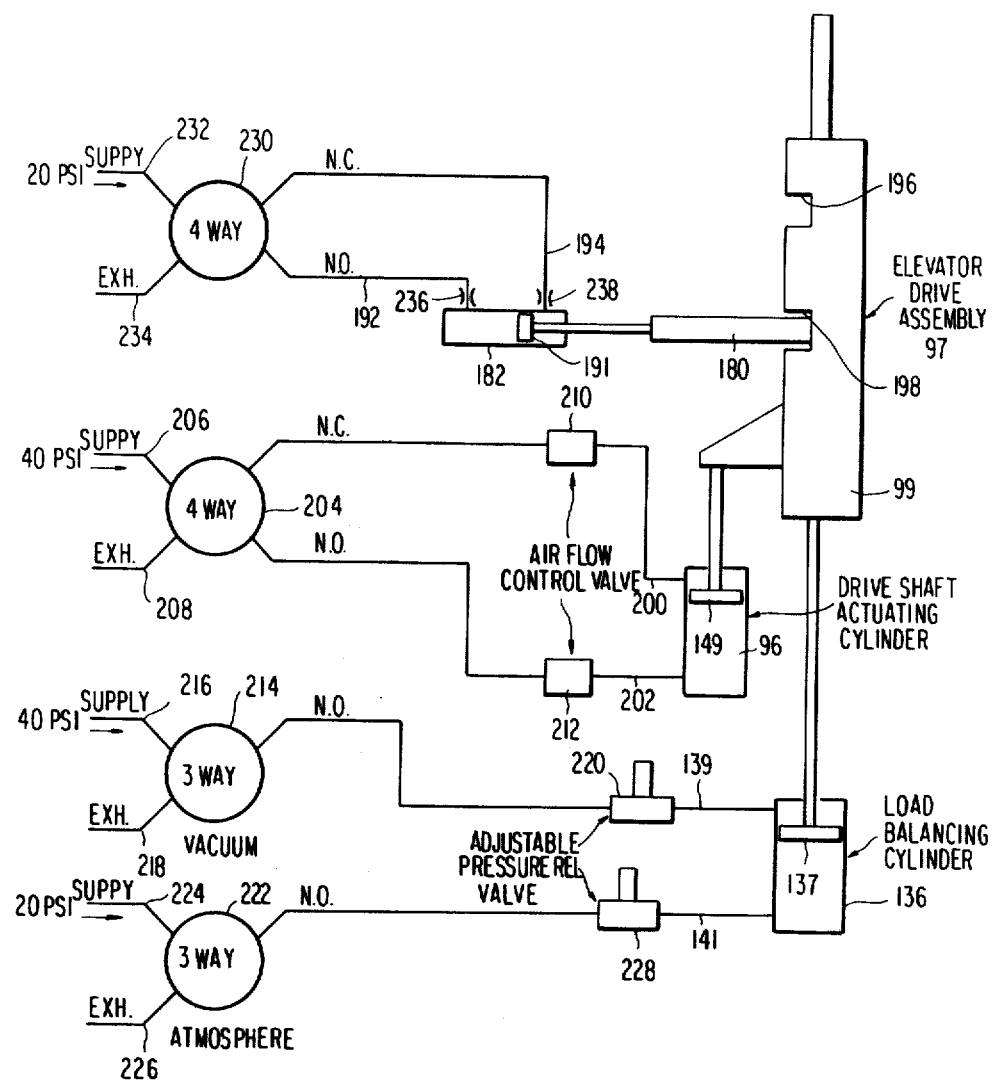
FIG. 2 is a schematic diagram of the control system for the elevator drive mechanism of FIG. 1.

Further reference may be had to FIG. 2 which illustrates schematically the pneumatic control system for elevator 30 and acting on elevator actuating drive shaft 99 of drive shaft assembly 97. Using this control system, the elevator actuating mechanism causes the elevator to be raised or lowered with minimal driving force (approximately 20 pounds). The light actuating force prevents damage to the wafer carrier or internal transfer mechanism, if the system is actuated out of sequence due to a logic or hardware failure. For drive shaft actuating cylinder 148, load balancing cylinder, 136 and locking slide actuating cylinder 182, positive air pressure is selectively supplied to a given side of the pistons carried within said cylinders at controlled pressure and exhausted therefrom by appropriate three-way and four-way valves. For the drive shaft actuating cylinder 96, lines 200 and 202, opening to opposite sides of piston 149, lead via four-way valve 204 to supply and exhaust lines 206, 208, respectively. Positive air pressure at 40 psi as indicated by the arrow is supplied to supply line 206. Within lines 200 and 202 are provided air flow control valves 210 and 212, respectively.

With respect to the load balancing cylinder 136, line 139 which opens to the top of piston 137, within that cylinder, leads to a three-way valve 214 and connects alternately to either supply line 216 or exhaust line 218. As indicated by the arrow, a positive air pressure of 40 psi is supplied selectively to the upper side of the load balancing cylinder piston 137 via three-way valve 214 or that side of the piston is vented to atmosphere. An adjustable pressure relief valve 220 is provided within line 139 intermediate of the three-way valve 214 and the load balancing cylinder 136.

Additionally, line 141 which leads to the bottom or lower side of the load balancing cylinder piston 137 connects by way of three-way valve 222 to supply line 224 and exhaust line 226. As indicated by the arrow, an air pressure of 20 psi is supplied to supply line 224 under control of the three-way valve 222. An adjustable pressure relief valve 228 is provided within line 141 intermediate of the three-way valve 222 and the load balancing cylinder 136.

The pressure relief valves 220, 228 function to ensure constant force back loading to elevator during raising and lowering, respectively, under vacuum and atmospheric pressure conditions for chamber 10.

With respect to the locking slide actuating cylinder 182, lines 194 and 192, opening respectively to opposite sides of piston 191 of that cylinder, are connected by way of a four-way valve 230 to supply line 232 and exhaust line 234. Air pressure at 20 psi is supplied to the supply line 232 as indicated by the arrow. Within lines 192 and 194, are provided fixed orifices 236, 238, respectively at the point where these lines connect to cylinder 182 providing speed control functions. As may be appreciated, supplying a pressure of 20 psi to the right side of piston 191 causes the piston 191 to shift to the left to disengage locking slide bar 180 from either notch 198 or 196, depending upon the vertical position of the elevator actuating drive shaft 99. As illustrated, lines 194 and 200 are normally closed lines, while lines 192, 202, 139 and 141 are normally open lines.

The adjustable pressure relief valves 220 and 228 are installed in the air lines leading to the load balancing cylinder 136 to maintain the desired air pressure when the piston 137 is displaced due to elevator travel. During normal operation (operating condition No. 1 referred to previously) of the elevator, the positive air pressure to the top of piston 137 of the balancing cylinder 136 is turned off after the elevator 30 is raised. This automatically insures a seal between the deformable, resilient O-ring in the top flange or rim 38 of the elevator and the diaphragm sealing surface provided by diaphragm 88 of the main vacuum chamber, at opening 24, due to pressure differential across the elevator platform 40. This structure forms a seal between the main vacuum chamber 10 and the antechamber 36. The locking slide bar 180 cannot be engaged or disengaged with the elevator actuating drive shaft 99 unless the air pressure is turned off to the load balancing cylinder 136. Before the elevator 30 can be lowered, the locking slide bar 180 must be disengaged from notch 198 of the elevator actuating drive shaft 99 and the air pressure turned back on the balancing cylinder 136, that is, applied to the upper face of the balancing cylinder piston 137. Switching to achieve this function is effected automatically by electronic hardware (not shown). The control system is responsive to pressures experienced internally of the main vacuum chamber 10 and the antechamber 36. Appropriate pressure sensors (not shown) may be provided for producing signals employed by an automatic control system for proper operation of each of the air cylinders 96, 136 and 182, in a further alternate embodiment. A conventional vacuum gauge may be provided internally of vacuum chamber 10, and vacuum chamber 10 is open to a turbomolecular vacuum pump or the like for maintaining the desired extremely low vacuum pressure within the main vacuum chamber. It is necessary to carefully control and restrict the pressures applied to the load balancing cylinder 136, the drive shaft actuating cylinder 96 and the locking slide actuating cylinder 182. Pressure regulators are provided (not shown) to supply lines 206, 224 and 232. Additionally, the rate of pressurized air flow to the drive shaft actuating cylinder 96 is controlled to control the speed of movement of the various elements including the elevator actuating drive shaft 99, thus controlling acceleration and deceleration of the elevator as it moves back and forth between raised and lowered positions. The elevator is selectively locked thereto by way of notches 196, 198 of the elevator actuating drive shaft 99 and the locking slide bar 180. The system may employ elevator up and down sensors in the form of LED photodetectors (not shown) with the sensors adjusted such that a flag (not shown) which may be mounted to the drive shaft assembly 97 does not engage more than 0.06 inches when in the maximum up or down position.

With respect to the locking slide actuating cylinder 182, preferably the air pressure for the illustrated embodiment of the invention capable of operating the locking slide is set at 20 psi, as indicated by the arrow feeding supply line 232. This will provide sufficient force to engage or disengage the slide bar by selective application of air pressure at 20 psi to given respective sides of piston 191 of that cylinder. The fixed orifices 236 and 238 control the operating speed of the cylinder 5 and thus the speed of locking and unlocking. The fixed orifice values may be different to effect a more rapid locking action as against unlocking action or vice versa. No adjustment is required.

The air pressure required to drive the elevator 30 up and down is shown to be 40 psi as supplied to supply line 206. This air pressure should not require adjustment from this setting to achieve smooth elevator travel in conjunction with balancing cylinder operation by way of piston 137. However, the air flow control valves 210 and 212, within lines 200 and 202 respectively, control the rate of air flow under this pressure to cylinder 96 varying the velocity of movement of the elevator actuating drive shaft 99 driven by the drive shaft actuating cylinder 96. These valves may be varied at will to control the speed of the elevator. Their adjustment additionally provides the required cycle time for raising and lowering of the elevator 30.

With respect to the load balancing cylinder 136, the upper end of this cylinder, that is, the chamber above the piston 137, is pressurized via supply line 216 by energization of three-way valve 214 to supply an air pressure at approximately 40 psi to the upper side of piston 137. Air pressure so applied functions to balance the forces exerted on the elevator mechanism when the system is in normal operating mode, that is, when chamber 10 is under vacuum with the antechamber also at this vacuum pressure. An approximately 40 psi air pressure should provide smooth operation of the elevator during movement from a lowered position to a raised position and vice versa.

If the elevator 30 does not go up or down smoothly at the same speed, this indicates that the air pressure to the cylinder 136 should be increased or decreased. If it moves up slowly and down rapidly, the pressure should be decreased. If it moves down slowly and up rapidly, the pressure should be increased to this side of cylinder 136. The pressure relief valve 220 located adjacent the cylinder port for line 139 must be adjusted to match the pressure setting of the regulator (not shown) within the supply line 216. This may be achieved by adjusting a set screw in the exit port of the relief valve 220, in the form of adjustable pressure relief valve proposed. This adjustment is achieved by adjusting one of two set screws, the first being a lock screw and the second which engages the spring and controls the release pressure. After setting the pressure regulator to control the function, the pressure relief valve should be adjusted to a point where it just stops leaking to the atmosphere. When the proper pressure is determined, a mark may be set on the lens of a pressure gauge (not shown) for reference, if such is employed.

The above described operation of the balance cylinder corresponds to operating condition No. 1 discussed previously.

With the antechamber and main chamber at high vacuum, there is exerted an approximately 140 pound upward force on the drive mechanism caused by atmosphere acting on the bottom of the elevator 30.

With the elevator 30 up and sealed and with the main vacuum chamber 10 at a high vacuum pressure and the antechamber at atmospheric pressure, the atmosphere acting on the bottom and top of the elevator and the weight of the mechanism causes a downward force of approximately 990 pounds to act on the drive mechanism. This is resisted by the locking slide bar 180 and notch 198 within the elevator actuating drive shaft 99.

Under the third operating condition where the complete system is at atmosphere, and where maintenance work is being carried on with respect to the vacuum chamber, the weight of the elevator components will apply a downward force of approximately 50 pounds on the drive mechanism, which must be compensated by applying positive air pressure to the load balancing system cylinder 136 on the bottom of piston 137. A 20 psi pressure may be supplied through line 224 upon energization of the three-way valve 222 which connects the supply line 224 to line 141 leading to the cylinder 136. With the bottom of the cylinder being pressurized at approximately 20 psi, the elevator 30 may be raised and lowered under a smooth operation. However, if the elevator moves up rapidly and down slowly, the pressure must be decreased to this side of the piston 137, within cylinder 136. This is achieved by adjusting the adjustable pressure relief valve 228 and a line regulator (not shown). If it moves up slowly and down rapidly, an increase in pressure must be provided to this face of piston 137. The procedure previously employed in adjusting the vacuum side of the balancing cylinder 136 is followed to adjust the pressure relief valve 228 which corresponds identically to pressure relief valve 220 within line 139.

To summarize, the elevator 30 is raised and lowered by a pneumatic drive shaft actuating cylinder 96 with flow controls employed for speed regulation. Regulation is achieved by throttling of air flow input to the cylinder via air flow control valves 210 and 212 within lines 200 and 202, respectively. Further, a mechanical, shiftable slide bar engages the elevator actuating drive shaft 99 to inhibit the elevator's motion during loss of power or air pressure. The air flow to achieve the elevator control functions is selectively supplied and suppressed by four solenoid valves, comprising, one four-way valve 204 controlling the up-down motion, one four-way valve 230 controlling the slide bar engage/disengage motion, and two three-way valves, 214, 222, controlling air flow to the balancing cylinder. Different air pressures are required on opposite sides of the cylinder piston 137. 40 psi is normally required on the top side of piston 137 under chamber 10 vacuum conditions to balance out the forces exerted on the system during raising and lowering of the elevator 30, while 20 psi air pressure is required on the lower face of piston 137 when the elevator mechanism is subjected to atmospheric pressure and there is a requirement to raise or lower the elevator 30.

It may be appreciated that the utilization of the load balancing cylinder 136 functions to produce an essentially zero mass condition for elevator 30 during both raising and lowering of the elevator. This permits the elevator to be moved by a light actuating force permitting its rapid movement, rapid acceleration during initial movement and rapid deceleration at the termination of that movement in a given direction both during raising and lowering, and insures during impact at any point, minimum shock and vibration transmission to the system and, in particular, to the electron beam column. The present invention has additional aspects which embellish upon this basic advancement in the art.

Specifically, this permits the elevator platform 40 to be driven home with a slight overtravel since the O-ring seal 82, while deforming slightly during contact with the resilient diaphragm 88, may flex the diaphragm upwardly and thus insure a high integrity vacuum seal between platform 40 and the vacuum chamber wall carried diaphragm 88. This is achieved upon initial contact with minimum dynamic force and subsequently with minimum static force acting between the resilient O-ring 82 and the flexible diaphragm 88, reducing shock and vibration transmission to the electron beam generator while also assuring a high integrity seal even if there is slight circumferential distortion or variance within the O-ring 82 and/or the flexible resilient metal diaphragm 88. The elevator assembly has resilient cushions on both the up and down stops to further minimize shock and possible chamber distortion during termination of the elevator movement at the end of the stroke in either direction. The incorporation of air flow control valves 210 and 212 in the lines leading to the drive shaft actuating cylinder 96 insures rapid but close control in the movement of the elevator drive assembly assisted by way of the drive shaft actuating cylinder 96. The utilization of the adjustable pressure relief valves and 220 and 228 within the lines leading to the load balancing cylinder 136 and the pressure regulators therein for respective supplies for the two different pressure levels, maintains a constant load balancing force during travel of the load balancing cylinder piston 137 driven by the drive shaft actuating cylinder 96. Further, while in the illustrated embodiment of the invention, there is only the necessity of manual switching in changing from a vacuum condition to a positive pressure condition for vacuum chamber 10, and the application of given pressures to the load balancing cylinders under such pressure conditions for effecting zero mass drive to the elevator mechanism, the present invention has full application to an automatic system in which pressure sensors are employed for continuously monitoring pressure conditions within the vacuum chamber 10, antechamber 36, or the atmosphere itself with lid 34 raised for automated control of the elevator drive mechanism. Further, by utilizing air cushion type pneumatic cylinders at 58 and 136, the deacceleration of the pistons is controlled at the end of each stroke without shock to the system. Both cylinders 58 and 136 may be ALCON Series K air cylinders with adjustable poppet cushions as manufactured by the Alkon Corporation of Wayne, New Jersey.

While the invention has been particularly shown and described with reference to a preferred embodiment thereof, it will be understood by those skilled in the art that various changes in form and details may be made therein without departing from the spirit and scope of the invention.

We claim:
1. In an electron beam writing system for beam writing on a work piece, said system including:
   a vacuum chamber,
   an elevator mechanism within said chamber to one side of the beam writing area, said mechanism including a workpiece bearing elevator platform and an elevator drive shaft assembly fixed to said platform and mounted to said chamber for vertically displacing said elevator platform within said chamber,
   actuating means coupled to said shaft assembly for vertically raising and lowering said elevator drive shaft assembly and said platform carried thereby, between a first raised position and a second lowered position,
   said vacuum chamber including wall means bearing a closable opening for permitting entry of workpieces into the vacuum chamber through said opening,
   means for subjecting said elevator mechanism to system vacuum pressure when said chamber is sealed off such that said vacuum pressure within said vacuum chamber tends to pull the elevator platform up, while when said wall opening means open, gravity effect on the elevator mechanism tends to pull said elevator platform downwardly within said vacuum chamber,
   the improvement comprising:
      load force counterbalancing means connected to said elevator drive shaft assembly for applying balancing forces for balancing out the vacuum pressure tending to pull the elevator platform up when the opening in the chamber wall means is sealed under chamber vacuum conditions and in the opposite direction to overcome the gravity force tending to pull the elevator platform down when said vacuum chamber is subjected to atmospheric pressure through said wall means opening, thereby placing said elevator mechanism in a condition of substantially zero mass under both vacuum chamber atmospheric and vacuum pressure conditions, thereby permitting rapid movement of said elevator platform by said elevator actuating means with minimal force and with minimal vibration and shock to said system during stoppage such that a first workpiece may be moved by the elevator mechanism while simultaneously electron beam writing may be effected on a second workpiece within said vacuum chamber, thereby increasing workpiece throughput.

2. The electron beam writing system as claimed in claim 1, wherein said vacuum chamber wall means opening for permitting entry of workpieces into the vacuum chamber through said opening is aligned with said elevator platform, and said elevator platform is movable into said opening to seal said chamber when the platform is in said vertically raised position, and wherein said system further comprises mechanical interlock means engageable with said elevator drive shaft assembly, at least when said elevator platform is in the raised position closing off the vacuum chamber to the exterior, to prevent platform movement away from said opening and accidental vacuum dump by the pressure differential existing across the elevator platform, between said vacuum chamber and the chamber exterior, and tending to force the elevator platform towards chamber open position; and wherein said mechanical interlock means comprises means for preventing release of said elevator drive shaft assembly until the pressure differential across said elevator platform is below a predetermined value.

3. The electron beam writing system as claimed in claim 2, wherein said system further comprises movable lid means overlying said opening and acting to vacuum seal said opening within said chamber wall from the atmosphere when said elevator platform is lowered from its raised position, said lid and said elevator platform cooperating to form an antechamber therebetween when said platform is in its raised position and said lid vacuum seals the opening in the wall of the chamber; and said system further comprises means for producing a vacuum in said antechamber after said platform receives a workpiece from the exterior of said chamber and before said platform is lowered from its raised, chamber closed position; and wherein said interlock means comprises means for preventing release of the elevator drive shaft until said movable lid is at chamber wall opening sealing position, and the pressure within said antechamber is reduced from atmospheric pressure to a predetermined vacuum pressure.

4. The electron beam writing system as claimed in claim 3, wherein said mechanical interlock means comprises a locking actuating slide cylinder in juxtaposition to said elevator drive shaft, said locking slide actuating cylinder including a laterally shiftable drive shaft locking bar movable towards and away from said drive shaft assembly, said drive shaft locking bar being shiftable by said locking slide actuating cylinder between projected and retracted positions, said drive shaft assembly including an actuating drive shaft and having a notch within the side of the same for receiving the end of said drive shaft locking bar when said drive shaft locking bar is in projected position and said platform is in the vertically raised position, a source of air pressure, means for supplying said source of air pressure selectively to said locking slide actuating cylinder to positively shift said drive shaft locking bar to said projected and retracted positions, a high frictional force being exerted on said drive shaft locking bar by contact of said drive shaft locking bar with said actuating drive shaft notch when said vacuum chamber is subjected to vacuum conditions and the surface of said platform covering said vacuum chamber wall opening is subjected to atmospheric pressure, and said system further including air pressure control means for limiting air pressure applied to said locking slide actuating cylinder in a direction tending to move said drive shaft locking bar from projected to retracted position to a level which is below the level of the frictional force acting on said drive shaft locking bar.

5. The electron beam writing system as claimed in claim 1, wherein said load force counterbalancing means comprises a load balancing cylinder fixedly mounted beneath said vacuum chamber and coaxial with said actuating drive shaft, a piston fixedly coupled to said actuating drive shaft and slidable within said load balancing cylinder, pressurized air supply means for providing air pressure at two different levels, and means for selectively supplying air pressure at one level to a given side of said load balancing cylinder piston when said elevator mechanism drives said elevator platform within said vacuum chamber under high vacuum conditions and for supplying air pressure at a different pressure level to a given side of said load balancing cylinder piston when said elevator mechanism is driving said elevator platform within said vacuum chamber under atmospheric pressure conditions to thereby place said elevator mechanism in a condition of substantially zero mass for each of said given conditions.

6. The electron beam writing system as claimed in claim 2, wherein said load force counterbalancing means comprises a load balancing cylinder fixedly mounted beneath said vacuum chamber and coaxial with said actuating drive shaft, a piston fixedly coupled to said actuating drive shaft and slidable within said load balancing cylinder, pressurized air supply means for providing air pressure at two different levels, and means for selectively supplying air pressure at one level to a given side of said load balancing cylinder piston when said elevator mechanism drives said elevator platform within said vacuum chamber under high vacuum conditions and for supplying air pressure at a different pressure level to a given side of said load balancing cylinder piston when said elevator mechanism is driving said elevator platform within said vacuum chamber under atmospheric pressure conditions to thereby place said elevator mechanism in a condition of substantially zero mass for each of said given conditions.

7. The electron beam writing system as claimed in claim 3, wherein said load force counterbalancing means comprises a load balancing cylinder fixedly mounted beneath said vacuum chamber and coaxial with said actuating drive shaft, a piston fixedly coupled to said actuating drive shaft and slidable within said load balancing cylinder, pressurized air supply means for providing air pressure at two different levels, and means for selectively supplying air pressure at one level to a given side of said load balancing cylinder piston when said elevator mechanism drives said elevator platform within said vacuum chamber under high vacuum conditions and for supplying air pressure at a different pressure level to a given side of said load balancing cylinder piston when said elevator mechanism is driving said elevator platform within said vacuum chamber under atmospheric pressure conditions to thereby place said elevator mechanism in a condition of substantially zero mass for each of said given conditions.

8. The electron beam writing system as claimed in claim 4, wherein said load force counterbalancing means comprises a load balancing cylinder fixedly mounted beneath said vacuum chamber and coaxial with said actuating drive shaft, a piston fixedly coupled to said actuating drive shaft and slidable within said load balancing cylinder, pressurized air supply means for providing air pressure at two different levels, and means for selectively supplying air pressure at one level to a given side of said load balancing cylinder piston when said elevator mechanism drives said elevator platform within said vacuum chamber under high vacuum conditions and for supplying air pressure at a different pressure level to a given side of said load balancing cylinder piston when said elevator mechanism is driving said elevator platform within said vacuum chamber under atmospheric pressure conditions to thereby place said elevator mechanism in a condition of substantially zero mass for each of said given conditions.

9. The electron beam writing system as claimed in claim 4, wherein said load force counterbalancing means comprises a load balancing cylinder fixedly mounted beneath said vacuum chamber and coaxial with said actuating drive shaft, a piston fixedly coupled to said actuating drive shaft and slidable within said load balancing cylinder, and wherein said actuating means comprises a drive shaft actuating cylinder mounted to the drive mechanism body parallel to the load balancing cylinder and to the side of said actuating drive shaft, said drive shaft actuating cylinder bearing a longitudinally extendable and retractable piston rod projecting from the end of said cylinder facing said elevator platform, an offset bracket fixedly mounted to said actuating drive shaft, on one side thereof, and having a portion projecting within the path of said drive shaft actuating cylinder piston rod, said rod bearing a piston on an end internally of said drive shaft actuating cylinder and having its opposite end coupled to said offset bracket such that extension and retraction of said drive shaft actuating cylinder piston rod causes said actuating drive shaft to be raised and lowered, and means for selectively supplying air under pressure to said drive shaft actuating cylinder to respective sides of said piston carried thereby at a controlled pressure and flow rate to shift said elevator platform between said upper raised position and said lowered position with respect thereto internally of said vacuum chamber to permit lateral transfer of the workpiece from said elevator platform for beam writing thereon.

10. The electron beam writing system as claimed in claim 9, wherein said vacuum chamber comprises a bottom wall, said elevator drive shaft projects through said bottom wall, a vibration isolation plate is fixedly mounted beneath said vacuum chamber bottom wall, and a resiliently cusioned up motion stop member is vertically adjustably mounted to said elevator drive shaft and includes a portion projecting radially therefrom to an extent that during upward movement of said elevator drive shaft said elevator platform is resiliently stopped by contact by said up motion stop member with said vibration isolation plate at said elevator raised position sealing said opening within said vacuum chamber and with said notch aligned with said drive shaft locking bar, and wherein said vacuum chamber further comprises a resiliently cushioned elevator stop member fixedly mounted to said platform within said vacuum chamber and an abutment within the vertical path of movement of said elevator platform stop member to resiliently limit the down movement of said elevator platform from said first raised position to a said second lowered position wherein said workpiece is below said opening within said vacuum chamber wall means and is accessible for transport to the side of the elevator mechanism for electron beam writing thereon.

* * * * *